US008443270B2

(12) United States Patent
Yuan et al.

(10) Patent No.: US 8,443,270 B2
(45) Date of Patent: May 14, 2013

(54) MULTIPLE INPUT HARDWARE REUSE USING LDPC CODES

(75) Inventors: Shaw Yuan, San Diego, CA (US); Arndt Mueller, San Diego, CA (US); Brian Eidson, San Diego, CA (US)

(73) Assignee: Entropic Communications, Inc., San Diego, CA (US)

( * ) Notice: Subject to any disclaimer, the term of this patent is extended or adjusted under 35 U.S.C. 154(b) by 975 days.

(21) Appl. No.: 12/331,292

(22) Filed: Dec. 9, 2008

(65) Prior Publication Data

US 2010/0146361 A1    Jun. 10, 2010

(51) Int. Cl.
G06F 11/00    (2006.01)

(52) U.S. Cl.
USPC ........... 714/794; 714/760; 714/752; 370/344; 375/262

(58) Field of Classification Search ........................ None
See application file for complete search history.

(56) References Cited

U.S. PATENT DOCUMENTS

| 7,237,171 | B2 | 6/2007 | Richardson | |
|---|---|---|---|---|
| 7,281,192 | B2 | 10/2007 | Shen | |
| 7,383,487 | B2 | 6/2008 | Shen | |
| 7,409,628 | B2 | 8/2008 | Tran | |
| 2006/0036928 | A1 | 2/2006 | Eroz | |
| 2007/0089024 | A1* | 4/2007 | Yu | 714/758 |
| 2007/0089027 | A1 | 4/2007 | Lim | |
| 2007/0157061 | A1 | 7/2007 | Lee | |
| 2008/0065953 | A1 | 3/2008 | Sun | |
| 2008/0109696 | A1* | 5/2008 | Lakkis | 714/752 |
| 2008/0126908 | A1 | 5/2008 | Lin | |
| 2008/0204286 | A1 | 8/2008 | Kose | |
| 2008/0215950 | A1 | 9/2008 | Shen | |
| 2008/0240277 | A1 | 10/2008 | Anholt | |

* cited by examiner

Primary Examiner — Scott Baderman
Assistant Examiner — Jason Bryan
(74) Attorney, Agent, or Firm — Bruce Greenhaus; Richard Bachand; Duane Morris LLP

(57) ABSTRACT

A network controller receives data substantially simultaneously from multiple client nodes. The network controller assigns to each client node one or more sub-carriers of an orthogonal frequency-division multiplexing access frequency spectrum. The client nodes transmit substantially simultaneously M LDPC codewords that are encoded in a parity check matrix so that the number of rows m' depend on the code rate and are mapped on its assigned sub-carriers. The network controller computes a bit log-likelihood ratio for each received bit of the codewords and arranges the bit LLR by codeword to align with an equivalent parity check matrix. The network controller decodes the codewords with the equivalent parity check matrix.

19 Claims, 8 Drawing Sheets

$$H = \begin{bmatrix} 1 & 0 & 1 & 0 & 0 & 1 & 0 & 0 & 1 & 0 & 0 & 0 \\ 0 & 1 & 0 & 1 & 1 & 0 & 0 & 0 & 0 & 1 & 0 & 0 \\ 0 & 1 & 0 & 0 & 0 & 1 & 0 & 1 & 0 & 0 & 1 & 0 \\ 1 & 0 & 0 & 0 & 1 & 0 & 1 & 0 & 0 & 0 & 0 & 1 \\ 0 & 0 & 1 & 0 & 0 & 0 & 0 & 1 & 0 & 1 & 0 & 1 \\ 0 & 0 & 0 & 1 & 0 & 0 & 1 & 0 & 1 & 0 & 1 & 0 \end{bmatrix}$$

Prior Art

Fig. 1

$$H_{OFDM} = \begin{bmatrix} H_{1,1} & H_{1,2} & H_{1,3} & \cdots & H_{1,n} \\ H_{2,1} & H_{2,2} & H_{2,3} & \cdots & H_{2,n} \\ H_{3,1} & H_{3,2} & H_{3,3} & \cdots & H_{3,n} \\ \vdots & \vdots & \vdots & \ddots & \vdots \\ H_{m,1} & H_{m,2} & H_{m,3} & \cdots & H_{m,n} \end{bmatrix}$$

Fig. 4

$$H_{ofdma} = \begin{bmatrix} h_{1,1} & h_{1,2} & h_{1,3} & \cdots & h_{1,n'} \\ h_{2,1} & h_{2,2} & h_{2,3} & \cdots & h_{2,n'} \\ h_{3,1} & h_{3,2} & h_{3,3} & \cdots & h_{3,n'} \\ \cdots & \cdots & \cdots & \cdots & \cdots \\ h_{m',1} & h_{m',2} & h_{m',3} & \cdots & h_{m',n'} \end{bmatrix}$$

Fig. 5

$$H_{eq} = \begin{bmatrix} Q_{1,1} & Q_{1,2} & Q_{1,3} & \cdots & Q_{1,n'} \\ Q_{2,1} & Q_{2,2} & Q_{2,3} & \cdots & Q_{2,n'} \\ Q_{3,1} & Q_{3,2} & Q_{3,3} & \cdots & Q_{3,n'} \\ \cdots & \cdots & \cdots & \cdots & \cdots \\ Q_{m',1} & Q_{m',2} & Q_{m',3} & \cdots & Q_{m',n'} \end{bmatrix}$$

Fig. 6

$$Q_{i,j} = \begin{bmatrix} h_{i,j}^{(1)} & 0 & 0 & \cdots & 0 \\ 0 & h_{i,j}^{(2)} & 0 & \cdots & 0 \\ 0 & 0 & h_{i,j}^{(3)} & \cdots & 0 \\ \vdots & \vdots & \vdots & \ddots & \vdots \\ 0 & 0 & 0 & \cdots & h_{i,j}^{(M)} \end{bmatrix}$$

MULTIPLE INPUT HARDWARE REUSE USING LDPC CODES

FIELD

This disclosure is directed generally to a communication network, and in particular to encoding and decoding digital data in a communication network.

BACKGROUND INFORMATION

Nearly all forms of electronic communication and storage systems use error-correcting codes. Error correcting codes compensate for the intrinsic unreliability of information transfer in these systems by introducing redundancy into the data stream. The mathematical foundations of error correcting were established by the Shannon-Hartley theorem, which defines for the channel a capacity, a quantity that specifies the maximum rate at which information can be reliably delivered through the channel.

Reliable transmission at rates approaching capacity requires the use of error correcting codes. Thus, error correcting codes are designed to achieve sufficient reliability while approaching capacity as closely as possible. The complexity of implementing the error correcting code is an additional factor that always comes into play in practical applications of error correcting codes. Recent advances in error correcting coding systems resulting from the invention of turbo codes and the subsequent rediscovery and development of low-density parity-check ("LDPC") codes offer coding systems of feasible complexity that can approach the Shannon-Hartley theorem capacity quite closely.

LDPC codes are defined by a sparse parity-check matrix H. This sparse matrix is often randomly generated, subject to the sparsity constraints. A valid codeword, x, based on a given parity check matrix, H, must satisfy the condition $0 = Hx$, where 0 is the all zeros vector. FIG. 1 illustrates an example sparse parity check matrix H for an LDPC code having a length of 12 (i.e., 12 columns in the matrix). Each row of the parity check matrix H represents a set of check equations that XOR to 0.

LDPC codes are well represented by bipartite graphs, often called Tanner graphs. FIG. 2 illustrates an example Tanner graph 20. Tanner graph 20 represents the parity check matrix, H, in which one set of nodes, the variable nodes 22, corresponds to bits of the codeword, and the other set of nodes, the check nodes 26, sometimes called constraint nodes, correspond to the set of parity check constraints which define the code. Edges 24 in the graph connect variable nodes 22 to check nodes 26. A variable node and a check node are said to be neighbors if they are connected by an edge in the graph. The number of connections on a check node is called check node degree $d_c$ or row weight. A decoder calculates a log-likelihood ratio ("LLR") for each of the bits according to variable nodes 22 connected by an edge 24 with a particular check node. The calculation is an iterative process that takes into account LLR values associated with each of the other variable nodes 22. Since the process is iterative, the calculation of the LLRs for each variable node 22 continues in successive passes updating the LLR value associated with each variable node 22 associated with one check node until the criteria for stopping the process has been achieved. Since the LLR value of each of the variable nodes 22 involved in the process will be recalculated and updated during the calculation, each variable node 22 can only be involved in one calculation at a time in a layered decoding architecture. That is, the calculation that is being done on the variable nodes 22 connected by edges 24 to a first check node 26a cannot be done simultaneously in a second check node operating on any of the same variable nodes 22. For example, variable node 22a is connected by an edge 24a to check node 26a. However, variable node 22a is also connected by an edge 24b to check node 26d. And yet, none of the same variable nodes 22 are connected to both check node 26a and check node 26b. Accordingly, the LLR can be calculated for all of the variable nodes 22 connected to check node 26a and check node 26b, but cannot be simultaneously calculated for all of the variable nodes connected to check node 26a and check node 26d (since at least one variable node 22a is connected to both check node 26a and check node 26d). It will be noted from both FIG. 1 and FIG. 2 that there is no common variable node 22 connected to both check node 26a and check node 26b. Likewise, there is no common variable node 22 between check node 26c and check node 26d, nor between check node 26e and check node 26f. Accordingly, the LLR calculation in this case can be performed by each such pair of check nodes simultaneously using two parallel sets of hardware (one set of hardware for calculating the LLRs associated with the variable nodes connected to the first check node 26a and the other set of hardware to calculate the LLRs associated with the variable nodes connected to the second check node 26b). Once the LLRs for the variable nodes 22 connected to the first pair 26a, 26b have been calculated in association with the first pair of check nodes 26a, 26b, hardware can be use to calculate the LLRs for the variable nodes 22 in connection with the second pair of check nodes 26c, 26d. It should be noted that each check node 26 is connected to four variable nodes 22. Accordingly, LLRs for eight of the twelve variable nodes 22 can be calculated at a time. Due to these limitations on calculating LLRs simultaneously, and due to a need for flexibility in how codes words are defined, and further due to the desire to efficiently use a common hardware architecture for various applications, a new architecture and method for decoding is needed.

SUMMARY

The disclosed method and apparatus provides a flexible architecture and method that allows the same hardware to be efficiently used to decode LDPC codewords of various lengths, depending upon how the data associated with the LDPC codewords are being transmitted. In one embodiment, a network controller assigns one or more sub-carriers of an Orthogonal Frequency Division Multiplexing Access ("OFDMA") frequency spectrum to each client node. Each of the client nodes transmits (substantially simultaneously) a plurality of Low Density Parity Check ("LDPC") codewords. The "M" codewords are encoded using a parity check matrix, H, in which the number of rows m' depends on the code rate. The codewords are mapped on the sub-carriers assigned to the transmitting node. The controller receives the codewords substantially simultaneously from the multiple client nodes over the assigned sub-carriers. The network controller computes a bit log-likelihood ratio ("LLR") for each received bit of the codewords. The controller then arranges the bit LLR by codeword to align with an equivalent parity check matrix. The network controller next decodes the codewords with the equivalent parity check matrix using essentially the same amount of hardware that is required to decode information that is sent from a single node over all of the OFDM sub-carriers.

BRIEF DESCRIPTION OF THE DRAWINGS

FIG. 1 illustrates an example sparse parity check matrix, H for an LDPC code having a length of 12.

FIG. 4 illustrates an example of an OFDM parity check matrix $H_{OFDM}$.

FIG. 5 illustrates an OFDMA parity check matrix, $H_{ofdma}$ in compact form in accordance with one embodiment.

FIG. 6 illustrates the corresponding equivalent parity check matrix, $H_{eq}$ utilized by a decoder for decoding M simultaneous codewords in accordance with one embodiment.

FIG. 7 illustrates the structure of the sub-matrices $Q_{i,j}$, that make up the equivalent parity check matrix, $H_{eq}$.

DETAILED DESCRIPTION

Figure 2:
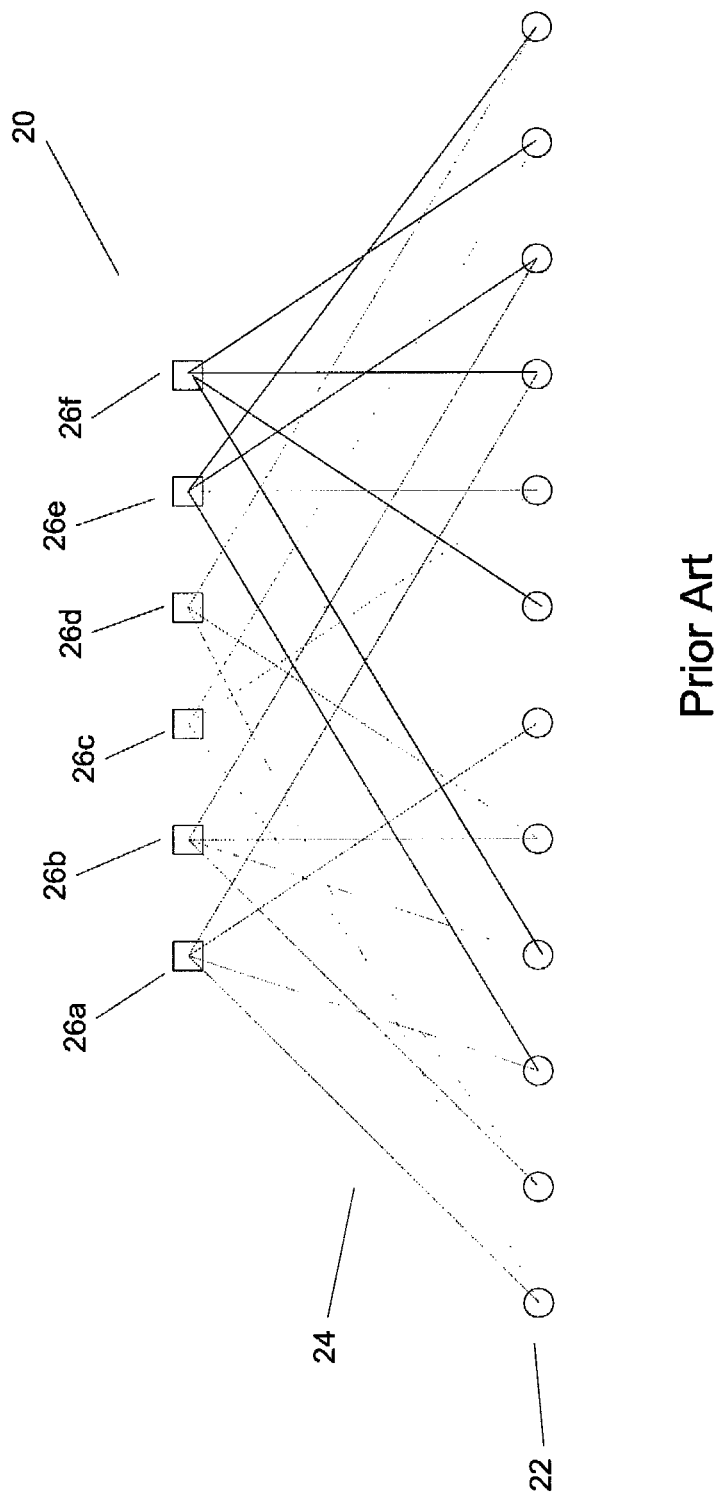
FIG. 2 illustrates an example Tanner graph.
Figure 3:
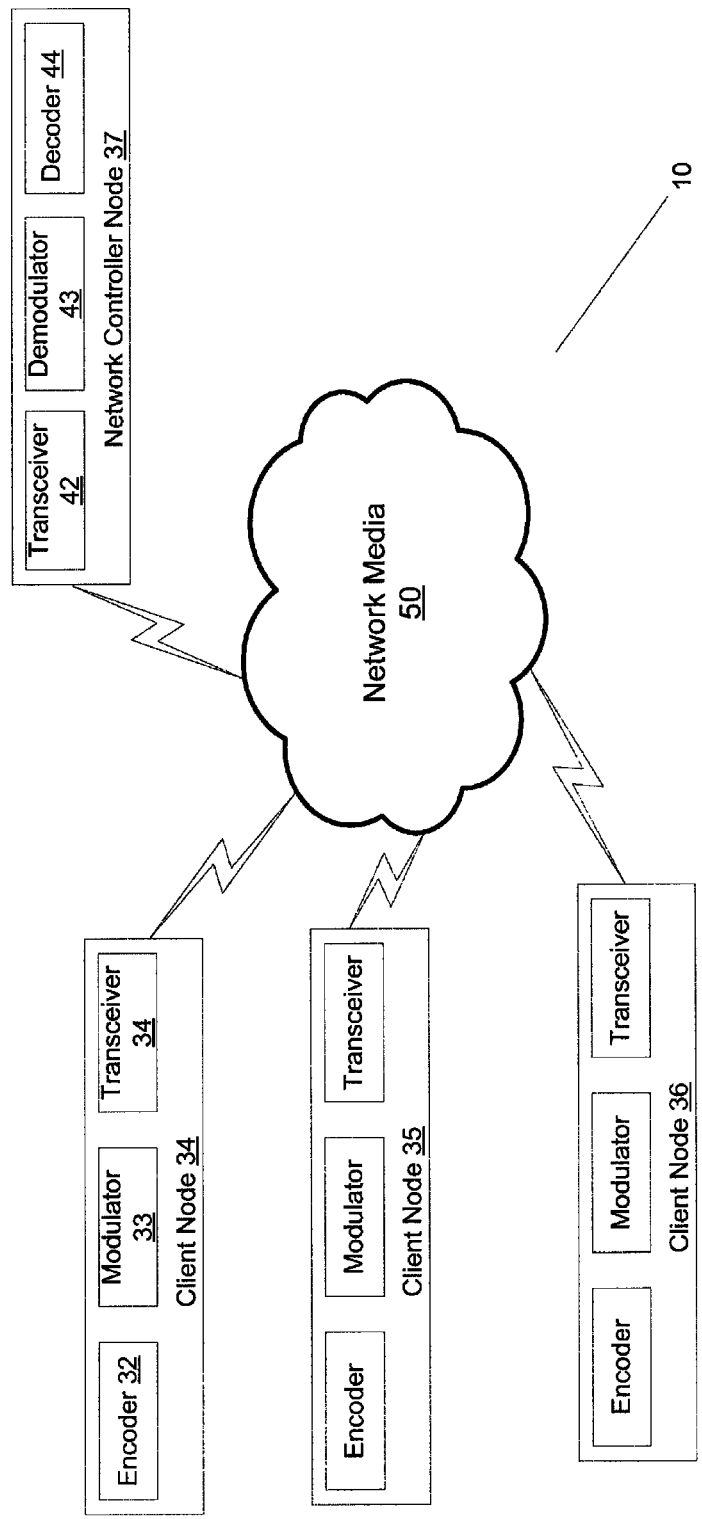
FIG. 3 is a block diagram of a network in accordance with one embodiment.

One embodiment of the disclosed method and apparatus is a communication system in which multiple nodes simultaneously transmit information to a single node. FIG. 3 is a block diagram of a network 10 in accordance with one such embodiment. Network 10 includes one or more client nodes 34-36 and a network controller ("NC") node 37. In one embodiment, network 10 is a network in a home environment, and nodes 34-37 are integrated with or coupled to devices in a home that communicate digital data in the form of messages between each other. Examples of such devices include set-top boxes, digital video recorders ("DVR"s), computers, televisions, routers, etc. Nodes 34-37 are coupled to a network media 50 over which the digital data is transferred. In one embodiment, network media 50 is coaxial cable. However, network media 50 may be any other type of media, including other wired media or wireless media. In one embodiment, network 10 is a full mesh network so that any node on the network can communicate directly with any of the other nodes on the network in any direction. Alternatively, the network 10 is an access network in which communications from client nodes must go through a central node, such as the network controller 37. In one embodiment, network 10 includes a single NC node and up to 15 client nodes.

Each client node 34-36 includes an encoder 32 for encoding data, a modulator 33 for modulating data, and a transceiver 34 for transmitting data. Similarly, NC node 37 includes a transceiver 42 for receiving data, a demodulator 43 for demodulating data, and a decoder 44 for decoding data. The embodiment of FIG. 3 illustrates a scenario, disclosed in more detail below, where multiple nodes (i.e., client nodes 34-36) are simultaneously transmitting data to a single node (i.e., NC node 37). However, in other embodiments, any node may transmit data to any other node, so each node will further include corresponding modules to accommodate this mode of operation. In one embodiment, encoders 32 and decoder 44 can be implemented by a general purpose processor executing software instructions that are stored on a computer readable media such as memory. In other embodiments, encoders 32 and decoder 44 can be implemented using specialized processors or with any combination of software or hardware.

In one embodiment, two or more client nodes 34-36 transmit data to NC node 37. In one embodiment, the data is transmitting using Orthogonal Frequency Division Multiple ("OFDM"). In general, OFDM uses a large number of closely-spaced orthogonal sub-carriers to carry data. Each sub-carrier is modulated with a conventional modulation scheme, such as quadrature amplitude modulation or phase shift keying. In some cases, the data is modulated at a low symbol rate to maintain a total data rate across all of the sub-carriers that is similar to the data rate achieved by a conventional single-carrier modulation scheme having the same bandwidth. Some prior art networks combine time division multiple access ("TDMA") schemes with OFDM so that each node can transmit in a separate time slot. TDMA used with OFDM can result in an inefficient use of the network media and frequency spectrum. In OFDMA, parallel decoders in the receiving node simultaneously decode every node. However, this requires additional hardware. Accordingly, conventional TDMA in which each node is assigned the entire OFDM spectrum of sub-carriers is inefficient in this scenario due to the lower ratio of data bits to packet overhead bits. In addition, because there will be some unfilled (i.e., unused) sub-carriers, conventional TDMA uses the spectrum inefficiently. In contrast, embodiments of the disclosed method and apparatus eliminate the need to either decode the simultaneously transmitted data using parallel decoders or transmit data at different time intervals.

In one embodiment, the data transmitted from nodes 34-36 is first encoded using Quasi-Cyclic LDPC ("QC-LDPC"). FIG. 4 illustrates an example of an OFDM parity check matrix $H_{OFDM}$. In this embodiment, the OFDM parity check matrix, $H_{OFMD}$ is divided into blocks of P×P square sub-matrices, $H_{i,j}$, where i has a value from 1 to m and j has a value from 1 to n. In this case, the size, P, of each of the sub-matrices, $H_{i,j}$, is referred to as the "expansion factor". Each sub-matrix $H_{i,j}$ is either: (1) an all zeros matrix, (2) an identity matrix; or (3) a cyclic shift of the identity matrix. To maximize decoding speed with minimum hardware in a layered decoding architecture, QC-LDPC OFDM codewords can be decoded with parallel hardware equal to the expansion factor, P.

One example of a system using QC-LDPC for each node transmitting data has a 10×48 parity check matrix $H_{OFDM}$ with 96×96 sub-matrices $H_{i,j}$ (i.e., P×P, where P=96). The resulting parity check matrix is 960×4608. The full OFDM codeword length is 4608 bits (the full length of the parity check matrix $H_{OFDM}$). If the decoder is designed with parallelism P=96, the decoder can simultaneously process 96 rows of the parity check equation (i.e., all of sub-matrices $H_{i,1}$ through $H_{i,48}$ of the parity check matrix $H_{OFDM}$).

However, in a multiple access embodiment where multiple client nodes or "users" communicate with the NC node, such as network 10 of FIG. 3, the data packets are typically much shorter than the 4608 bits in the above example and may not occupy all of the OFDM subcarriers. In such networks, each node is typically allocated a mutually exclusive subset of the sub-carriers. This scheme is called Orthogonal Frequency Division Multiple Access ("OFDMA"). The allocated sub-carriers are modulated in combination to form an OFDMA symbol. In one embodiment, in order to achieve maximum hardware reuse and decoding efficiency, available sub-carriers are partitioned among the number of client nodes to ensure that it takes the same amount of time to transmit an OFDMA codeword from one client node as it does from each other client node.

The OFDMA codewords will be shorter than an OFDM codewords to accommodate multiple client nodes. Accordingly, using the currently disclosed method and apparatus, the same decoder is configured to decode M simultaneous OFDMA codewords without a significant increase from the amount of hardware required to decode one OFDM codeword.

FIG. 5 is an illustration of an OFDMA parity check matrix, $H_{OFDMA}$. When M client nodes are transmitting data packets simultaneously, to decode M simultaneous client nodes and maintain the same amount of hardware, the OFDMA data packet LDPC is M times shorter than the OFDM data packet LDPC. In addition, the expansion factor is also M times less. For example, if the number of simultaneous client nodes is M=8, the OFDMA codeword length is 4608/8=576 bits and the expansion factor P'=P/M=96/8=12. In the example in which the OFDMA expansion factor, P' is equal to 12, by definition each of the sub-matrices, $h_{m',n'}$, has a dimension of 12×12. Each such sub-matrix, $h_{m',n'}$, is either an all zeros matrix, a identity matrix, or a cyclic shift of the identity matrix, similar to the sub-matrices $H_{m,n}$ of the OFDM parity check matrix, $H_{OFDM}$. Accordingly, the OFDMA parity check matrix, $H_{OFDMA}$, is a total of 576 bits across (i.e., 48 sub-matrices times 12 bits across each sub-matrix). This example provides a satisfactory compromise between the number of simultaneous client nodes and coding performance. Note that the OFDMA parity check matrix, $H_{OFDMA}$, has the same number of columns of sub-matrices as the OFDM parity matrix $H_{OFDM}$ of FIG. 4 (i.e., n=n') but the number of rows m' could differ depending on the code rate.

Each of the M client nodes will simultaneously transmit LDPC encoded data packets using the OFDMA parity matrix, $H_{OFDMA}$. When the data packets are received by the receiving network controller node 37 (see FIG. 3), the decoder 44 will need to arrange the data packets in order to allow for simultaneous decoding of the data packets received from all M client nodes. In accordance with the disclosed method and apparatus, this requires the information presented in each of the parity matrices, $H_{OFDMA}$, from each client node to be combined to form a new matrix, referred to herein as an "equivalent parity check matrix", $H_{eq}$.

FIG. 6 illustrates the equivalent parity check matrix, $H_{eq}$ utilized by decoder 44 for decoding M simultaneous codewords in accordance with one embodiment. FIG. 7 shows the structure of the sub-matrices $Q_{i,j}$, that make up the equivalent parity check matrix, $H_{eq}$. Each sub-matrix $Q_{i,j}$ is further made up of 12×12 sub-sub-matrices. Each of the off-diagonal sub-sub-matrices is a 12×12 zero matrix (all elements equal to zero), as indicated by a zero shown in FIG. 7. Each of the sub-sub-matrices $h_{i,j}^{(k)}$ on the diagonal, where k is a value from 1 to M, is taken from the received OFDMA parity check matrix, $H_{OFDMA}$ sent by the $k^{th}$ client node. Accordingly, the sub-sub-matrix $h_{1,1}^{(1)}$ in the first row and first column of $Q_{1,1}$ is the sub-matrix $h_{1,1}$ sent in $H_{OFDMA}$ by the $1^{st}$ of the M client nodes. The sub-sub-matrix $h_{1,1}^{(4)}$ in the fourth row and fourth column of $Q_{1,1}$ is the sub-matrix $h_{1,1}$ sent in $H_{OFDMA}$ by the $4^{th}$ of the M client nodes. The sub-sub-matrix $h_{1,1}^{(8)}$ in the eighth row and eighth column is the sub-matrix $h_{1,1}$ sent in $H_{OFDMA}$ by the $8^{th}$ of the M client nodes.

In the present example, since sub-matrix $Q_{i,j}$ is made up of M×M sub-sub-matrices, each of size 12×12, the sub-matrix $Q_{i,j}$ has dimensions of 96×96 (P×P, where P is the expansion factor of the OFDM parity check matrix shown in FIG. 4).

Noting that the equivalent parity matrix of FIG. 6 is made of m'×n' sub-matrices $Q_{m',n'}$, each of P×P, the size of the resulting parity check matrix, $H_{eq}$ is m'P×n'P. Recalling that the length n of the OFDM parity matrix $H_{OFDM}$ is the same as the length n' of the OFDMA parity matrix $H_{OFDMA}$ the length in bits of these two matrices is equal. Therefore, with minimal hardware increase relative to the prior art, a decoder that is designed for a OFDM length LDPC can be configured to decode M simultaneous OFDMA LDPCs with the equivalent parity check matrix of FIG. 6.

In addition to the example where n=n' as disclosed above, other embodiments include:
n'>n: the combined OFDMA codewords are longer than the OFDM length data packet LDPC. This embodiment uses a larger buffer to hold the OFDMA data for processing.
n'<n: combined OFDMA codewords shorter than the OFDM length data packet LDPC.
P'<P/M: use of a smaller expansion factor than allowed and results in unused processing units.

In an embodiment in which the number of simultaneous client nodes is M=8, the OFDMA codeword length is equal to 4608 (the OFDM codeword length) divided by 8=576 bits. In this embodiment, the OFDMA expansion factor P' is equal to the OFDM expansion factor P divided by M=96/8=12. A bit log-likelihood ratio ("LLR") is calculated for each bit of each of the M OFDMA codewords to be simultaneously decoded. The LLR for each bit is rearranged as indicated by the equivalent parity check matrix, $H_{eq}$ shown in FIG. 6. The arrangement indicated by the equivalent parity check matrix, $H_{eq}$ allows the most efficient use of the hardware (i.e., calculations of several LLRs can be made simultaneously ensuring that all of the processing capability of the decoder is in full use).

Figure 8:
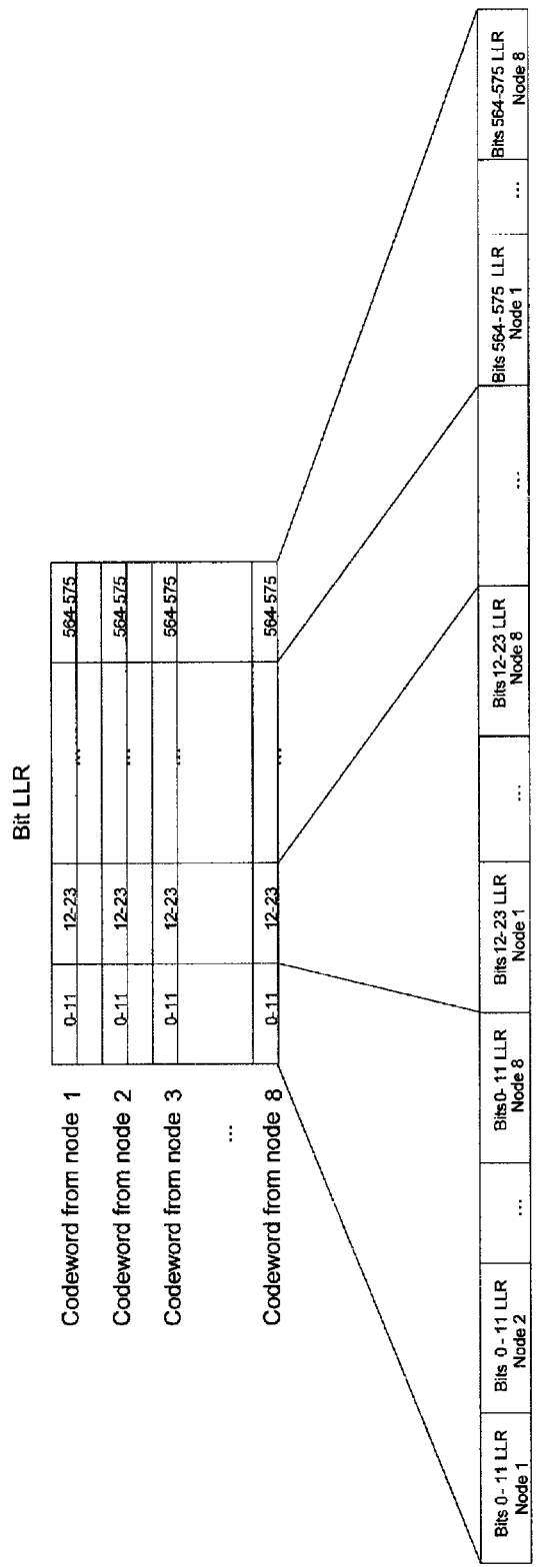
FIG. 8 illustrates the relative positions of LLRs in a memory buffer for M=8 where a client node could potentially be assigned more than one codeword.

FIG. 8 illustrates the relative locations in a buffer memory in which the LLRs calculated for 4608 bits (i.e., the diagonal sub-sub-matrix of the equivalent parity check matrix, $H_{eq}$ of FIG. 6) are stored for M=8. It should be noted that in one embodiment, a client node is assigned more than one codeword. As shown in FIG. 8, the first 12 bits from each codeword are arranged serially, and then the next 12 bits from each codeword, and so on. Since decoder 44 in one embodiment can process up to 8 OFDMA codewords simultaneously, in a scenario where less than 8 client nodes are in the network some of the nodes with more data to transmit can be assigned with more than one codewords. The relative bit position of each codeword of each transmitting node is shown in FIG. 8.

Figure 9:
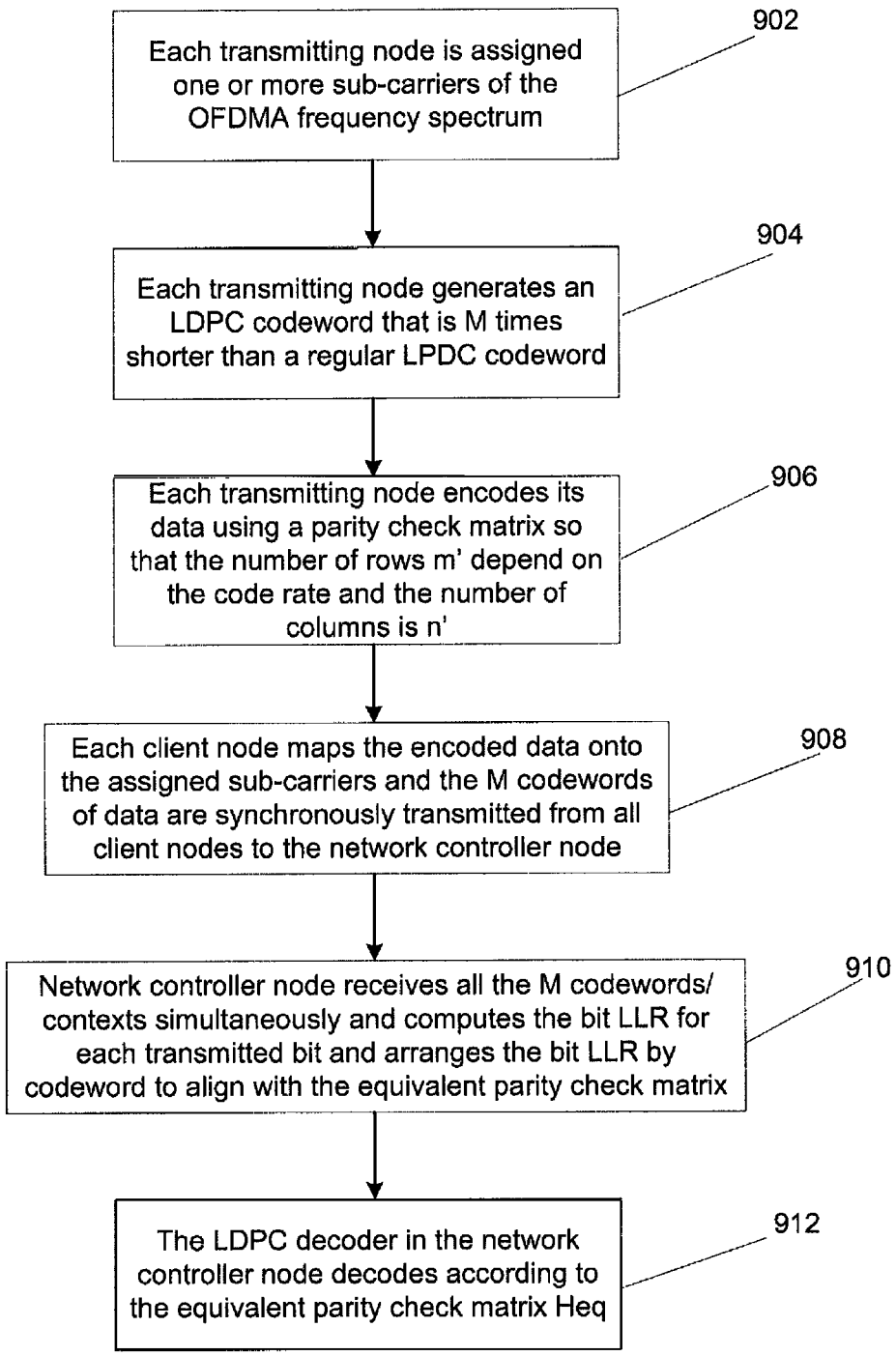
FIG. 9 is a flow diagram of the functionality of the network in encoding and decoding digital data simultaneously transmitted from multiple transmitting/client nodes to a receiving/network controller node.

FIG. 9 is a flow diagram of the functions performed by network 10 in encoding and decoding digital data simultaneously transmitted from multiple transmitting/client nodes to a receiving/network controller node. In one embodiment, the digital data in the network has an "OFDM" LDPC codeword length, which refers to the non-shortened version of the LDPC codeword that is used when the entire OFDM spectrum is allocated to one client node. In one embodiment, the functions shown in the flow diagram of FIG. 9 are implemented by software stored in memory or other computer readable or tangible medium, and executed by a processor. In other embodiments, the functions may be performed by hardware (e.g., through the use of an application specific integrated circuit ("ASIC"), a programmable gate array ("PGA"), a field programmable gate array ("FPGA"), etc.), or any combination of hardware and software.

At 902, each client node is assigned one or more sub-carriers of the OFDMA frequency spectrum.

At 904, each client node generates an OFDMA LDPC codeword that is M times shorter than a OFDM LDPC codeword and the total number of codewords is M.

At 906, each client node encodes its data according to the parity check matrix of FIG. 5 so that the number of rows m' depend on the code rate and the number of columns is n'.

At 908, each client node maps the encoded data onto the assigned sub-carriers and the M codewords of data are substantially synchronously transmitted from all client nodes to the network controller node.

At 910, the network controller node receives all the M codewords simultaneously and computes the bit LLR for each transmitted bit and arranges the bit LLR by codeword to align with the equivalent parity check matrix as shown in FIG. 8.

At 912, the LDPC decoder in the network controller node decodes according to the equivalent parity check matrix, $H_{eq}$ of FIG. 6 where $H_{eq}$ is formed of sub-matrices $Q_{i,j}$ and each sub-matrix $Q_{i,j}$ is an M×M block matrix with sub-matrices $h_{i,j}$ down the main diagonal. Each $h_{i,j}$ sub-matrix is P'×P', where P'=P/M. When the decoding is completed, the decoded information is reassembled according to its associated codeword for higher layer processing.

In another embodiment, instead of each sub-matrix $h_{ij}$ down the main diagonal of the $Q_{i,j}$ sub-matrix of FIG. 7 having the same values and dimensions (width, m' and length, n'), parity check matrices $h_{i,j}^{(k)}$ having different values and dimensions can be used for different codewords used so that the sub-matrices can be generalized as $h_{i,j}^{(k)}$. In this embodiment, the total expansion factor is $$P_t = \sum_{i=1}^{M} P^{(i)} \le P,$$

where $P^{(i)}$ is the expansion factor of the $i^{th}$ codeword. Since $h_{i,j}^{(k)}$ is $P^{(k)} \times P^{(k)}$ and $Q_{ij}$ is $P_t \times P_t$, the length of the resulting parity check matrix, $H_{eq}$ is m'P$_t$×N which is the same length as the OFDM length data packet LDPC. The off diagonal zeros sub-matrices of FIG. 7 have a width equal to the width of the sub-matrix in the diagonal that is in that same row and a length equal to the length of the sub-matrix in the diagonal that is in that same column and are not necessarily square. In addition to the example where n=n' as disclosed above, other embodiments include:

- n'>n: the combined OFDMA codewords are longer than the OFDM length data packet LDPC. This embodiment uses a larger buffer to hold the OFDMA data for processing.
- n'<n: combined OFDMA codewords shorter than the OFDM length data packet LDPC.
- $P_t$<P: use of a smaller expansion factor than allowed and results in unused processing units.

Several embodiments are specifically illustrated and/or described herein. However, it will be appreciated that modifications and variations of the disclosed embodiments are covered by the above teachings and within the purview of the appended claims without departing from the spirit and intended scope of the invention.

What is claimed is:

1. A non-transitory computer readable media having instructions stored thereon that, when executed by a processor, causes the processor to decode data received from a plurality of transmitting nodes, the instructions comprising logic for:
   - assigning to each transmitting node one or more sub-carriers of an Orthogonal frequency-division multiplexing access (OFDMA) frequency spectrum;
   - receiving M codewords from the transmitting nodes, wherein the codewords are low-density parity-check (LDPC) codewords and are encoded in a parity check matrix so that a number of rows m' depend on a code rate and are mapped on the assigned sub-carrier;
   - computing a bit log-likelihood ratio for each received bit of the codewords and arranging the bit LLR by codeword to align with an equivalent parity check matrix;
   - decoding the codewords with the equivalent parity check matrix;

wherein each of the codewords are M times shorter than an Orthogonal frequency-division multiplexing (OFDM) LDPC codeword.

2. The non-transitory computer readable media of claim 1, wherein the encoded parity check matrix comprises:

$$H_{ofdma} = \begin{bmatrix} h_{1,1} & h_{1,2} & h_{1,3} & \ldots & h_{1,n'} \\ h_{2,1} & h_{2,2} & h_{2,3} & \ldots & h_{2,n'} \\ h_{3,1} & h_{3,2} & h_{3,3} & \ldots & h_{3,n'} \\ \vdots & \vdots & \vdots & \ddots & \vdots \\ h_{m',1} & h_{m',2} & h_{m',3} & \ldots & h_{m',n'} \end{bmatrix}.$$

3. The non-transitory computer readable media of claim 1, wherein the equivalent parity check, matrix comprises:

$$H_{eq} = \begin{bmatrix} Q_{1,1} & Q_{1,2} & Q_{1,3} & \ldots & Q_{1,n'} \\ Q_{2,1} & Q_{2,2} & Q_{2,3} & \ldots & Q_{2,n'} \\ Q_{3,1} & Q_{3,2} & Q_{3,3} & \ldots & Q_{3,n'} \\ \vdots & \vdots & \vdots & \ddots & \vdots \\ Q_{m',1} & Q_{m',2} & Q_{m',3} & \ldots & Q_{m',n'} \end{bmatrix}; \text{wherein}$$

$$Q_{i,j} = \begin{bmatrix} h_{i,j}^{(1)} & 0 & 0 & \ldots & 0 \\ 0 & h_{i,j}^{(2)} & 0 & \ldots & 0 \\ 0 & 0 & h_{i,j}^{(3)} & \ldots & 0 \\ \vdots & \vdots & \vdots & \ddots & \vdots \\ 0 & 0 & 0 & \ldots & h_{i,j}^{(M)} \end{bmatrix} \text{ and}$$

each $h_{i,j}$ sub-matrix is P'×P' and P'=P/M, wherein P is the expansion factor for the OFDM parity check matrix and P' is the expansion factor for the OFDMA parity check matrix.

4. The non-transitory computer readable media of claim 1, wherein the equivalent parity check matrix comprises:

$$H_{eq} = \begin{bmatrix} Q_{1,1} & Q_{1,2} & Q_{1,3} & \ldots & Q_{1,n'} \\ Q_{2,1} & Q_{2,2} & Q_{2,3} & \ldots & Q_{2,n'} \\ Q_{3,1} & Q_{3,2} & Q_{3,3} & \ldots & Q_{3,n'} \\ \vdots & \vdots & \vdots & \ddots & \vdots \\ Q_{m',1} & Q_{m',2} & Q_{m',3} & \ldots & Q_{m',n'} \end{bmatrix}; \text{wherein}$$

$$Q_{i,j} = \begin{bmatrix} h_{i,j}^{(1)} & 0 & 0 & \ldots & 0 \\ 0 & h_{i,j}^{(2)} & 0 & \ldots & 0 \\ 0 & 0 & h_{i,j}^{(3)} & \ldots & 0 \\ \vdots & \vdots & \vdots & \ddots & \vdots \\ 0 & 0 & 0 & \ldots & h_{i,j}^{(M)} \end{bmatrix} \text{ and}$$

each $h_{i,j}^{(k)}$ sub-matrix is $P^{(k)} \times P^{(k)}$ and $Q_{ij}$ is $P_t \times P_t$ and a total expansion factor is $$P_t = \sum_{i=1}^{M} P^{(i)} \le P,$$

where $P^{(i)}$ is an expansion factor of the $i^{th}$ codeword, P is the expansion factor for the OFDM parity check matrix.

5. The non-transitory computer readable media of claim 4, wherein each $h_{i,j}^{(k)}$ sub-matrix is square, but wherein the dimension of each sub-matrix is independent of the other on-diagonal sub-matrices.

6. The non-transitory computer readable media of claim 4, wherein each zero sub-matrix is has a width equal to the width of the sub-matrix in the diagonal that is in that same row and a length equal to the length of the sub-matrix in the diagonal that is in that same column.

7. A system for decoding data from a plurality of transmitting nodes, the system comprising:

means for assigning to each transmitting nodes one or more sub-carriers of an Orthogonal frequency-division multiplexing access (OFDMA) frequency spectrum;

means for receiving M codewords from the transmitting nodes, wherein the codewords are low-density parity-check (LDPC) codewords and are encoded in a parity check matrix so that a number of rows m' depend on a code rate and are mapped on the assigned sub-carrier;

means for computing a hit log-likelihood ratio for each received hit of the codewords and arranging the bit LLR by codeword to align with an equivalent parity check matrix;

means for decoding the codewords with the equivalent parity check matrix; and wherein each of the codewords are M times shorter than an Orthogonal frequency-division multiplexing (OFDM) LDPC codeword.

8. A network node comprising:

a transceiver;

a demodulator coupled to the transceiver; and a decoder coupled to the demodulator, wherein the decoder is adapted to:

assign to each of a plurality of transmitting nodes one or more sub-carriers of an Orthogonal frequency-division multiplexing access (ODFMA) frequency spectrum;

receive M codewords from the transmitting nodes, wherein the codewords are low-density parity-check (LDPC) codewords and are encoded in a parity check matrix so that a number of rows m' depend on a code rate and are mapped on the assigned sub-carrier;

compute a bit log-likelihood ratio for each received hit of the codewords and arranging the bit LLR by codeword to align with an equivalent parity check matrix;

decode the codewords with the equivalent parity check matrix; and wherein each of the codewords are M times shorter than an Orthogonal frequency-division multiplexing (OFDM) LDPC codeword.

9. The network node of claim 8, wherein the encoded parity check matrix comprises:

$$H_{ofdma} = \begin{bmatrix} h_{1,1} & h_{1,2} & h_{1,3} & \cdots & h_{1,n'} \\ h_{2,1} & h_{2,2} & h_{2,3} & \cdots & h_{2,n'} \\ h_{3,1} & h_{3,2} & h_{3,3} & \cdots & h_{3,n'} \\ \vdots & \vdots & \vdots & \ddots & \vdots \\ h_{m',1} & h_{m',2} & h_{m',3} & \cdots & h_{m',n'} \end{bmatrix}.$$

10. The network node of claim 8, wherein the equivalent parity check matrix comprises:

$$H_{eq} = \begin{bmatrix} Q_{1,1} & Q_{1,2} & Q_{1,3} & \cdots & Q_{1,n'} \\ Q_{2,1} & Q_{2,2} & Q_{2,3} & \cdots & Q_{2,n'} \\ Q_{3,1} & Q_{3,2} & Q_{3,3} & \cdots & Q_{3,n'} \\ \vdots & \vdots & \vdots & \ddots & \vdots \\ Q_{m',1} & Q_{m',2} & Q_{m',3} & \cdots & Q_{m',n'} \end{bmatrix};$$ wherein $$Q_{i,j} = \begin{bmatrix} h_{i,j}^{(1)} & 0 & 0 & \cdots & 0 \\ 0 & h_{i,j}^{(2)} & 0 & \cdots & 0 \\ 0 & 0 & h_{i,j}^{(3)} & \cdots & 0 \\ \vdots & \vdots & \vdots & \ddots & \vdots \\ 0 & 0 & 0 & \cdots & h_{i,j}^{(M)} \end{bmatrix}$$ and each $h_{i,j}$ sub-matrix is P'×P' and P'=P/M, wherein P is the expansion factor for the OFDM parity check matrix and P' is the expansion factor for the OFDMA parity check matrix.

11. The network node of claim 8, wherein the equivalent parity check matrix comprises:

$$H_{eq} = \begin{bmatrix} Q_{1,1} & Q_{1,2} & Q_{1,3} & \cdots & Q_{1,n'} \\ Q_{2,1} & Q_{2,2} & Q_{2,3} & \cdots & Q_{3,n'} \\ Q_{3,1} & Q_{3,2} & Q_{3,3} & \cdots & Q_{3,n'} \\ \vdots & \vdots & \vdots & \ddots & \vdots \\ Q_{m',1} & Q_{m',2} & Q_{m',3} & \cdots & Q_{m',n'} \end{bmatrix};$$ wherein $$Q_{i,j} = \begin{bmatrix} h_{i,j}^{(1)} & 0 & 0 & \cdots & 0 \\ 0 & h_{i,j}^{(2)} & 0 & \cdots & 0 \\ 0 & 0 & h_{i,j}^{(3)} & \cdots & 0 \\ \vdots & \vdots & \vdots & \ddots & \vdots \\ 0 & 0 & 0 & \cdots & h_{i,j}^{(M)} \end{bmatrix}$$ and each $h_{i,j}^{(k)}$ sub-matrix is $P^{(k)} \times P^{(k)}$ and $Q_{ij}$ is $P_t \times P_t$ and a total expansion factor is $$P_t = \sum_{i=1}^{M} P^{(i)} \leq P,$$

where $P^{(i)}$ is an expansion factor of the $i^{th}$ codeword, P is the expansion factor for the OFDM parity check matrix.

12. The network node of claim 11, wherein each $h_{i,j}^{(k)}$ sub-matrix is square, but wherein the dimension of each sub-matrix is independent of the other on-diagonal sub-matrices.

13. The network node of claim 12, wherein each zero sub-matrix is has a width equal to the width of the sub-matrix in the diagonal that is in that same row and a length equal to the length of the sub-matrix in the diagonal that is in that same column.

14. A non-transitory computer readable media having instructions stored thereon that, when executed by a processor, causes the processor to decode data received from a plurality of transmitting nodes, the instructions comprising logic for:

assigning to each transmitting nodes one or more sub-carriers of an Orthogonal frequency-division multiplexing access (OFDMA) frequency spectrum;

receiving M codewords from the transmitting nodes, wherein the codewords are low-density parity-check (LDPC) codewords and are encoded in a parity check matrix so that a number of rows m' depend on a code rate and are mapped on the assigned sub-carrier;

computing a bit log-likelihood ratio for each received bit of the codewords and arranging the bit LLR by codeword to align with an equivalent parity check matrix;

decoding the codewords with the equivalent parity check matrix;

wherein the equivalent parity check matrix comprises:

$$H_{eq} = \begin{bmatrix} Q_{1,1} & Q_{1,2} & Q_{1,3} & \cdots & Q_{1,n'} \\ Q_{2,1} & Q_{2,2} & Q_{2,3} & \cdots & Q_{2,n'} \\ Q_{3,1} & Q_{3,2} & Q_{3,3} & \cdots & Q_{3,n'} \\ \vdots & \vdots & \vdots & \ddots & \vdots \\ Q_{m',1} & Q_{m',2} & Q_{m',3} & \cdots & Q_{m',n'} \end{bmatrix}; \text{wherein}$$

$$Q_{i,j} = \begin{bmatrix} h_{i,j}^{(1)} & 0 & 0 & \cdots & 0 \\ 0 & h_{i,j}^{(2)} & 0 & \cdots & 0 \\ 0 & 0 & h_{i,j}^{(3)} & \cdots & 0 \\ \vdots & \vdots & \vdots & \ddots & \vdots \\ 0 & 0 & 0 & \cdots & h_{i,j}^{(M)} \end{bmatrix} \text{ and}$$

each $h_{i,j}^{(k)}$ sub-matrix is $P^{(k)} \times P^{(k)}$ and $Q_{ij}$ is $P_t \times P_t$ and a total expansion factor is $$P_t = \sum_{i=1}^{M} P^{(i)} \le P,$$

where $P^{(i)}$ is an expansion factor of the $i^{th}$ codeword, P is the expansion factor for the Orthogonal frequency-division multiplexing (OFDM) parity check matrix; and wherein each $h_{i,j}^{(k)}$ sub-matrix is square, but wherein the dimension of each sub-matrix is independent of the other on-diagonal sub-matrices.

15. The non-transitory computer readable media of claim 14, wherein the encoded parity check matrix comprises:

$$H_{ofdma} = \begin{bmatrix} h_{1,1} & h_{1,2} & h_{1,3} & \cdots & h_{1,n'} \\ h_{2,1} & h_{2,2} & h_{2,3} & \cdots & h_{2,n'} \\ h_{3,1} & h_{3,2} & h_{3,3} & \cdots & h_{3,n'} \\ \vdots & \vdots & \vdots & \ddots & \vdots \\ h_{m',1} & h_{m',2} & h_{m',3} & \cdots & h_{m',n'} \end{bmatrix}.$$

16. The non-transitory computer readable media of claim 14, wherein each zero sub-matrix is has a width equal to the width of the sub-matrix in the diagonal that is in that same row and a length equal to the length of the sub-matrix in the diagonal that is in that same column.

17. A network node comprising:
a transceiver;
a demodulator coupled to the transceiver; and
a decoder coupled to the demodulator, wherein the decoder is adapted to:
assign to each of a plurality of transmitting nodes one or more sub-carriers of an Orthogonal frequency-division multiplexing access (ODFMA) frequency spectrum;

receive M codewords from the transmitting nodes, wherein the codewords are low-density parity-check (LDPC) codewords and are encoded in a parity check matrix so that a number of rows m' depend on a code rate and are mapped on the assigned sub-carrier;

compute a bit log-likelihood ratio for each received bit of the codewords and arranging the bit LLR by codeword to align with an equivalent parity check matrix;

decode the codewords with the equivalent parity check matrix;

wherein the equivalent parity check matrix comprises:

$$H_{eq} = \begin{bmatrix} Q_{1,1} & Q_{1,2} & Q_{1,3} & \cdots & Q_{1,n'} \\ Q_{2,1} & Q_{2,2} & Q_{2,3} & \cdots & Q_{2,n'} \\ Q_{3,1} & Q_{3,2} & Q_{3,3} & \cdots & Q_{3,n'} \\ \vdots & \vdots & \vdots & \ddots & \vdots \\ Q_{m',1} & Q_{m',2} & Q_{m',3} & \cdots & Q_{m',n'} \end{bmatrix}; \text{wherein}$$

$$Q_{i,j} = \begin{bmatrix} h_{i,j}^{(1)} & 0 & 0 & \cdots & 0 \\ 0 & h_{i,j}^{(2)} & 0 & \cdots & 0 \\ 0 & 0 & h_{i,j}^{(3)} & \cdots & 0 \\ \vdots & \vdots & \vdots & \ddots & \vdots \\ 0 & 0 & 0 & \cdots & h_{i,j}^{(M)} \end{bmatrix} \text{ and}$$

each $h_{i,j}^{(k)}$ sub-matrix is $P^{(k)} \times P^{(k)}$ and $Q_{ij}$ is $P_t \times P_t$ and a total expansion factor is $$P_t = \sum_{i=1}^{M} P^{(i)} \le P,$$

where $P^{(i)}$ is an expansion factor of the $i^{th}$ codeword, P is the expansion factor for the Orthogonal frequency-division multiplexing (OFDM) parity check matrix; and wherein each $h_{i,j}^{(k)}$ sub-matrix is square, but wherein the dimension of each sub-matrix is independent of the other on-diagonal sub-matrices.

18. The network node of claim 17, wherein each zero sub-matrix is has a width equal to the width of the sub-matrix in the diagonal that is in that same row and a length equal to the length of the sub-matrix in the diagonal that is in that same column.

19. A system for decoding data from a plurality of transmitting nodes, the system comprising:
means for assigning to each transmitting nodes one or more sub-carriers of an orthogonal frequency-division multiplexing access (OFDMA) frequency spectrum;
means for receiving M codewords from the transmitting nodes, wherein the codewords are low-density parity-check (LDPC) codewords and are encoded in a parity check matrix so that a number of rows m' depend on a code rate and are mapped on the assigned sub-carrier;
means for computing a bit log-likelihood ratio for each received bit of the codewords and arranging the bit LLR by codeword to align with an equivalent parity check matrix;
means for decoding the codewords with the equivalent parity check matrix; and
wherein the equivalent parity check matrix comprises:

$$H_{eq} = \begin{bmatrix} Q_{1,1} & Q_{1,2} & Q_{1,3} & \cdots & Q_{1,n'} \\ Q_{2,1} & Q_{2,2} & Q_{2,3} & \cdots & Q_{2,n'} \\ Q_{3,1} & Q_{3,2} & Q_{3,3} & \cdots & Q_{3,n'} \\ \vdots & \vdots & \vdots & \ddots & \vdots \\ Q_{m',1} & Q_{m',2} & Q_{m',3} & \cdots & Q_{m',n'} \end{bmatrix}; \text{wherein}$$

$$Q_{i,j} = \begin{bmatrix} h_{i,j}^{(1)} & 0 & 0 & \cdots & 0 \\ 0 & h_{i,j}^{(2)} & 0 & \cdots & 0 \\ 0 & 0 & h_{i,j}^{(3)} & \cdots & 0 \\ \vdots & \vdots & \vdots & \ddots & \vdots \\ 0 & 0 & 0 & \cdots & h_{i,j}^{(M)} \end{bmatrix} \text{ and}$$

each $h_{i,j}^{(k)}$ sub-matrix is $P^{(k)} \times P^{(k)}$ and $Q_{ij}$ is $P_t \times P_t$ and a total expansion factor is $$P_t = \sum_{i=1}^{M} P^{(i)} \leq P,$$

where $P^{(i)}$ is an expansion factor of the $i^{th}$ codeword, P is the expansion factor for the orthogonal frequency-division multiplexing (OFDM) parity check matrix; and wherein each $h_{i,j}^{(k)}$ sub-matrix is square, but wherein the dimension of each sub-matrix is independent of the other on-diagonal sub-matrices.

\* \* \* \* \*